United States Patent
Sankaran

(10) Patent No.: US 6,940,429 B2
(45) Date of Patent: Sep. 6, 2005

(54) METHOD OF CONTEXT BASED ADAPTIVE BINARY ARITHMETIC ENCODING WITH DECOUPLED RANGE RE-NORMALIZATION AND BIT INSERTION

(75) Inventor: Jagadeesh Sankaran, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/856,707

(22) Filed: May 26, 2004

(65) Prior Publication Data

US 2005/0001745 A1 Jan. 6, 2005

Related U.S. Application Data

(60) Provisional application No. 60/474,290, filed on May 28, 2003.

(51) Int. Cl.$^7$ ............................ H03M 7/40; H03M 7/00
(52) U.S. Cl. ........................ 341/65; 341/107; 382/239; 382/246; 706/15
(58) Field of Search ............................ 341/65, 50, 51, 341/107; 382/239, 246; 706/15

(56) References Cited

U.S. PATENT DOCUMENTS 6,381,371 B1 * 4/2002 Epstein et al. .............. 382/246
6,560,368 B1 * 5/2003 Brown et al. ............... 382/239
6,633,856 B2 * 10/2003 Richardson et al. .......... 706/15
6,812,873 B1 * 11/2004 Siohan et al. ............... 341/107
6,825,782 B2 * 11/2004 Bossen ....................... 341/107
6,850,175 B1 * 2/2005 Bossen ....................... 341/107

* cited by examiner

Primary Examiner—Jean Bruner Jeanglaude
(74) Attorney, Agent, or Firm—Robert D. Marshall, Jr.; W. James Brady, III; Frederick J. Telecky, Jr.

(57) ABSTRACT

This invention increases the available instruction level parallelism (IPC) of CABAC encoding by decoupling the re-normalization loop and the bit-insertion task required to create the encoded bit-stream. This makes all software implementations of CABAC based encoding significantly faster on digital signal processors that can exploit instruction level parallelism such as very long instruction word (VLIW) digital signal processors. In a joint hardware/software implementation, this invention employs existing Huffman variable length encoding hardware with minimum modifications. The de-coupling of these two tasks of this invention exposes previously hidden underlying instruction level parallelism and task level parallelism.

7 Claims, 3 Drawing Sheets

METHOD OF CONTEXT BASED ADAPTIVE BINARY ARITHMETIC ENCODING WITH DECOUPLED RANGE RE-NORMALIZATION AND BIT INSERTION

CLAIM OF PRIORITY

This application claims priority under 35 U.S.C. 119(e)(1) from U.S. Provisional Application No. 60/474,290 filed May 28, 2003.

TECHNICAL FIELD OF THE INVENTION

The technical field of this invention is data encoding using Context based Adaptive Binary Arithmetic Encoding (CABAC).

BACKGROUND OF THE INVENTION

Context based Adaptive Binary Arithmetic Encoding (CABAC) is a method of data compression. This method is inherently serial by nature. This has made previous implementations of this method on a digital signal processor (DSP) very compute intensive compared to Huffman data compression algorithms. This computation intensity prevented the arithmetic encoder from being adopted for the early video coding standards proposed by the Motion Picture Expert Group (MPEG) such as MPEG-2 and MPEG-4. However the newer standards such as Joint Picture Expert Group (JPEG) JPEG 2000 for still pictures and H.264 for video conferencing use this method.

SUMMARY OF THE INVENTION

This invention increases the available instruction level parallelism (IPC) of CABAC encoding by decoupling the re-normalization loop and the bit-insertion task required to create the encoded bit-stream. This makes all software implementations of CABAC based encoding significantly faster on digital signal processors that can exploit instruction level parallelism such as very long instruction word (VLIW) digital signal processors. This de-coupling permits multi-processing to improve performance either in an all software approach or a combined software/hardware solution. When a joint hardware/software solution is employed, this invention employs Huffman variable length encoding hardware with minimum modifications. Such hardware to support Huffman encoding may already be present on the data processor employed. This ability to support CABAC with minimal changes to existing Huffman hardware makes this invention particularly attractive. In terms of computer architecture, this approach adds task level parallelism (TLP) on top of the instruction level parallelism (ILP) from the decoupling of the re-normalization and bit insertion. The de-coupling of these two tasks of this invention thus exposes previously hidden underlying instruction level parallelism and task level parallelism.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
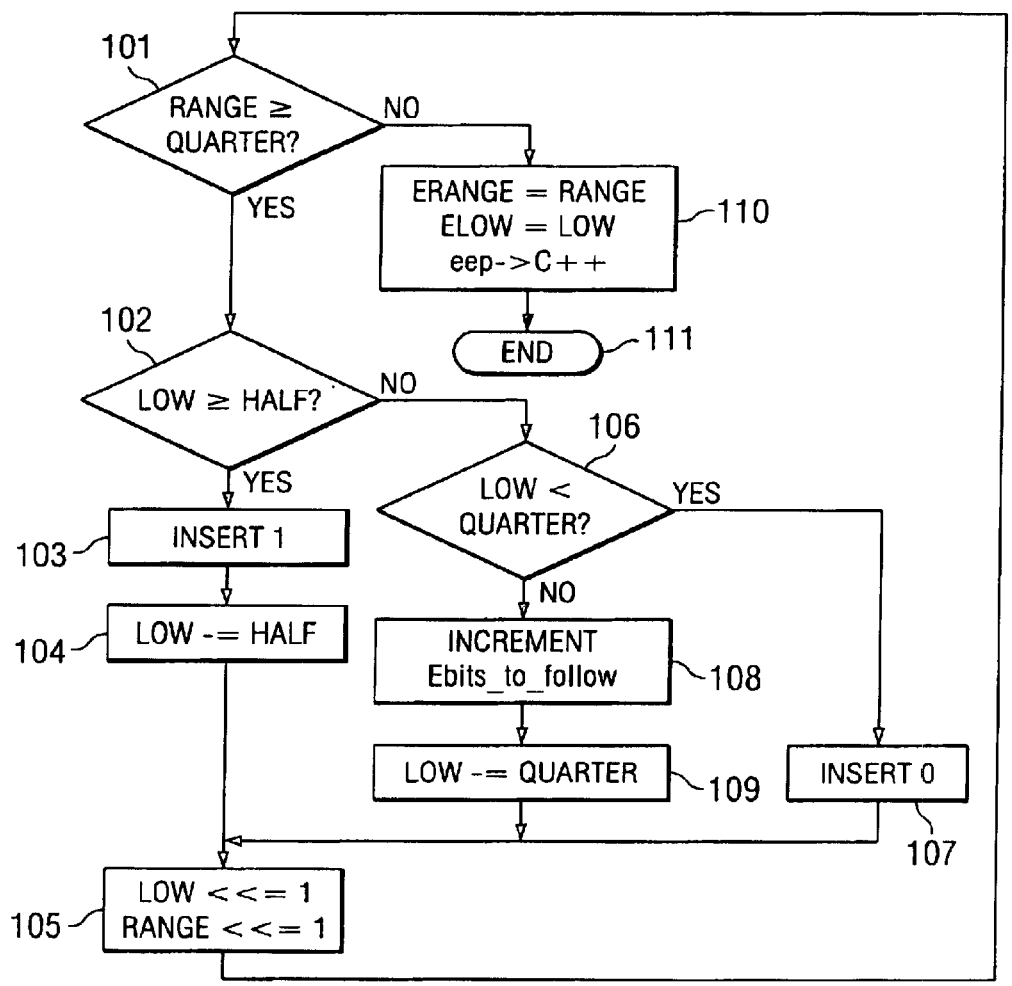
FIG. 1 illustrates the re-normalization function of the prior art.

The listing below is the original C code from the H.264 standard showing the procedure to encode a binary symbol. The C variable is symbol which may have either of the two values (1,0) and is thus a binary symbol. Non-binary data must be converted into a binary string by binarization. To improve the compression efficiency, the standard attempts to force a long string of '0's or '1's depending on which has been chosen to be Most Probable Symbol (MPS). The function "biari_encode_symbol" is the heart of the CABAC encoding engine. The compute intensive portion of this function is the re-normalization loop. The re-normalization loop ensures that the low and high values of the arithmetic encoder are not too close. If these become too close the encoded data may be incorrectly decoded. This re-normalization loop re-normalizes the values of low and high in the range (0, 1]), so that they are at least separated by a QUARTER (0.25). During this process bits in the upper half of the interval used to represent the state of the arithmetic encoder are taken off and inserted into the bit-stream. The combination of two factors makes this re-normalization compute intensive. First, the algorithm does not know how many times the re-normalization loop is going to run. In addition, as this process is being evaluated the algorithm performs a variable field insertion to generate the bit-stream. These factors significantly lower the available parallelism of a CABAC implementation.

```
***********************************************************
* \file biariencode.c
* \brief
*    Routines for binary arithmetic encoding
* \author
*    Main contributors (see contributors.h for copyright,
*    address and affiliation details)
*    - Detlev Marpe           <marpe@hhi.de>
*    - Gabi Blaettermann      <blaetter@hhi.de>
***********************************************************/
/***********************************************************
*    Macro for writing bytes of code
***********************************************************/
#define put_byte( ) { \
    Ecodestrm[(*Ecodestrm_len)++] = Ebuffer; \
    Ebits_to_go = 8; \
    while (eep->C > 7) { \
        eep->C-=8; \
        eep->E++; \
    } \
}
#define put_one_bit(b) { \
    Ebuffer <<= 1; Ebuffer |= (b); \
    if (--Ebits_to_go == 0) \
        put_byte( ); \
}
#define put_one_bit_plus_outstanding(b) { \
    put_one_bit(b); \
    while (Ebits_to_follow > 0) \
```

-continued

```
    } \
        Ebits_to_follow--; \
        put_one_bit(!(b)); \
    } \
}
/***************************************************************
* \brief
*   Actually arithmetic encoding of one binary symbol by
*   using the probability estimate of its associated
*   context model
***************************************************************/
void biari_encode_symbol(EncodingEnvironmentPtr eep, signed
    short symbol, BiContextTypePtr bi_ct )
}
    register unsigned int range = Erange;
    register unsigned int low = Elow;
    unsigned int rLPS = rLPS_table_64x4[bi_ct->state]
        [(range>>6) & 3];
    extern int cabac_encoding;
    if( cabac_encoding )
    {
        bi_ct->count++;
    }
/*  covers all cases where code does not bother to shift
*   down symbol to be either 0 or 1, e.g. in some cases for
*   cbp, mb_Type etc the code simply masks off the bit
*   position and passes in the resulting value        */
if (symbol != 0)      symbol = 1;
range -= rLPS;
if (symbol != bi_ct->MPS)
{
    low += range;
    range = rLPS;
    if (!bi_ct->state)
        bi_ct->MPS = bi_ct->MPS ^ 1;
                // switch LPS if necessary
    bi_ct->state = AC_next_state_LPS_64[bi_ct->state];
                // next state
}
else
    bi_ct->state = AC_next_state_MPS_64[bi_ct->state];
                // next state
/*  Renormalization LOOP with bit-insertion           */
while (range < QUARTER)
{
    if (low >= HALF)
        {
            put_one_bit_plus_outstanding(1);
            low -= HALF;
        }
    else
        if (low < QUARTER)
        {
            put_one_bit_plus_outstanding(0);
        }
        else
        {
            Ebits_to_follow++;
            low -= QUARTER;
        }
    low <<= 1;
    range <<= 1;
}
Erange = range;
Elow = low;
eep->C++;
}
```

FIG. 1 illustrates this prior art process. The re-normalization function first tests to determine if the range is less than QUARTER (decision block 101). If so (Yes at decision block 101), the re-normalization process tests to determine if low is greater than or equal to HALF (decision block 102). If so (Yes at decision block 102), then the re-normalization process inserts a "1" into the encoded bit stream (processing block 103) and then HALF is subtracted from low (processing block 104). Next the re-normalization process left shifts low and range by one bit (processing block 105) effectively multiplying these variables by 2. Control then returns to the beginning of the loop at decision block 101.

In case low is not greater than or equal to HALF (No at decision block 102), then the re-normalization process tests to determine if low is less than QUARTER (decision block 106). If so (Yes at decision block 106), then the re-normalization process inserts a "0" into the bit stream (processing block 107). The re-normalization process then left shifts low and range (processing block 105) and returns to the beginning of the loop at decision block 101. If low is not less than QUARTER (No at decision block 106), the re-normalization process increments Ebits_to_follow (processing block 108). As shown in the above program listing, Ebits_to_follow is used in the 1 and 0 inserts of respective processing blocks 103 and 107. The re-normalization process then subtracts QUARTER from low (processing block 109). The re-normalization process then left shifts low and range (processing block 105) and returns to the beginning of the loop at decision block 101.

The re-normalization process continues in this loop until range is greater than or equal to QUARTER (No at decision block 101). If this is the case, the re-normalization performs some final functions (processing block 110) and ends (exit block 111).

The modified method of this invention is based on the following observations. The prior art re-normalization loop iterates for a variable number of times that cannot be predetermined by the compiler. This forces an un-warranted dependency in the compiler which limits performance. Particularly, this limits the parallelism of the algorithm. The bit-insertion routine is done by determining after how many iterations that low≦HALF or that low<QUARTER. The goal is to keep range greater than QUARTER on a number line between (0,1]. The need to insert a variable number of bits as determined by the re-normalization loop further limits the parallelism.

This invention proposes these changes to the prior art re-normalization loop. This invention de-couples the variable bit-insertion and the re-normalization loop process. The bit-insertion may be performed in software or through a minor variation of a variable length code (VLC)/variable length decode (VLD) co-processor. This invention optionally determines up-front the number of iterations the re-normalization loop will iterate. This is accomplished through a mathematical operation supported by the Texas Instruments TMS320C6000 instruction set.

In a first embodiment of this invention, the re-normalization loop is modified to temporarily store the intermediate results as follows. Two temporary arrays "bits" and "foll" are used to record the "bit" to insert, followed by the number of bits to follow. The number of bits to follow is the 1's complement of the bit in the bits array. For example, if bits [0]='0' and foll [0]=5, then the symbol to be inserted has a length 6 and is "011111". Similarly, if bits [1]='1' and foll [1]=4, then the symbol to be inserted has a length 5 and is "10000". Hence the VLC/VLD co-processor will accept array bits [n] and a corresponding array foll [n] and generate the coded bit-stream of symbols based on the above rule and in a packed fashion. The advantage of this aspect of the invention is that the generation of the packed bits can proceed in parallel with the re-normalization of other symbols to encode (TLP). The de-coupling of the bit-insertion, in parallel with the re-normalization makes the re-normalization loop simpler to optimize. This enables the complier to achieve a greater amount of instruction level parallelism (ILP). Even in a pure software implementation, these two operations can be factored into two loops to improve scheduling as shown below.

```
/*  renormalization                                    */
while (range < QUARTER)
{
    if (low >= HALF)
    {
        // put_one_bit_plus_outstanding(1);
        low -= HALF;
        bits[num_entries] = 1;
        foll[num_entries] = Ebits_to_follow;
        Ebits_to_follow = 0;
        num_entries ++;
    }
    else
        if (low < QUARTER)
        {
            // put_one_bit_plus_outstanding(0);
            bits[num_entries] = 0;
            foll[num_entries] = Ebits_to_follow;
            Ebits_to_follow = 0;
            num_entries ++;
        }
        else
        {
            Ebits_to_follow++;
            low -= QUARTER;
        }
    low <<= 1;
    range <<= 1;
}
Ebits_to_follow_exit = Ebits_to_follow;
for ( it = 0; it < num_entries; it++)
{
    Ebits_to_follow = foll[it];
    put_one_bit_plus_outstanding(bits[it]);
}
```

The re-normalization loop shown above can be coded into assembly code for the Texas Instruments TMS320C6400 yielding a performance of 4 cycles/iteration for re-normalization. Each encode bit may have several iterations of re-normalization pass. This is typically from 0 to 3 and 7 passes for the last symbol. The sequence of instructions for the re-normalization loop is shown below:

```
; low = low_d initially
; After first iteration, low_d = low/2
; ThRESH = QUARTER initially
; After first iteration THRESH = EIGHT
LOOP:
            CMPLTU    A_HALF_1,   A_low,      A_fg0    ; fg0=(HALF - 1)<LOW ;LOW>=HALF
            CMPLTU    A_low_d,    A_THRESH,   A_fg1    ; fg1 = low < QUART
            OR        A_fg0,      A_fg1,      A_for    ; for = fg0 || fg1
            MV        A_low,      A_low_d              ; copy
[A_fg0]     SUB       A_low,      A_HALF,     A_low_d  ; if (fg0) low -= HALF
[A_fg0]     STB       B_1,        *B_b++               ; if (fg0) store 1
[A_fg1]     STB       B_0,        *B_b++               ; if (fg1) store 0
[A_for]     STB       B_foll,     *B_f++               ; if (fg0 or fg1) store foll
[A_for]     ZERO      B_foll                           ; if (fg0 or fg1) foll = 0
[!A_for]    ADD       B_foll,     1,          B_foll   ; if (!fg2) foll++
[!A_for]    SUB       A_low,      A_QUART,    A_low_d  ; if (!fg2) low -= QUARTER
            SHL       A_low_d,    1,          A_low    ; low << 1
[B_i]       MV        B_EIGHT,    A_THRESH             ; thresh = 1/8 after first iter.
            BDEC      LOOP,       B_iters              ; branch
Scheduled code:
* ================= PIPE LOOP KERNEL ================= *
LOOP:
    MV          .S1   A_low,      A_low_d         ;[3,1] copy
|| CMPLTU       .L1   A_HALF_1,   A_low,     A_fg0 ;[3,1] fg0 = (HALF - 1) < LOW;
   [A_fg0]STB   .D2T2 B_1,        *B_b++           ;[4,1] if (fg0) store 1
||[ A_fg0]SUB   .D1   A_low,      A_HALF,    A_low_d ;[4,1] if (fg0) low -= HALF
||     OR       .S1   A_fg0,      A_fg1,     A_for  ;[4,1] for = fg0 || fg1
   [B_i]MV      .D1X  B_EIGHT,    A_THRESH         ;[5,1] thresh = 1/8 after first
||[!A_for]SUB   .L1   A_low,      A_QUART,   A_low_d ;[5,1] if (!fg2) low-=QUART
||[A_for]ZERO   .L2   B_foll                       ;[5,1] if (fg0 or fg1) foll = 0
||[A_for]STB    .D2T2 B_foll,     *B_f++           ;[5,1] if (fg0 or fg1) store foll
||     BDEC     .S2   LOOP,       B_iters          ;[1,2] branch
   [A_fg1]STB   .D2T2 B_0,        *B_b++           ;[6,1] if (fg1) store 0
||     SHL      .S1   A_low_d,    1,         A_low ;[6,1] low << 1
||[!A_for]ADD   .S2   B_foll,     1,         B_foll ;[ 6,1] if (!fg2) foll++
||     CMPLTU   .L1   A_low_d,    A_THRESH,  A_fg1  ;[2,2] fg1 = low < QUART
```

This code for the Texas Instruments TMS320C6000 family of digital signal processors should be interpreted as follows. Each instruction includes: an indication of scheduled parallel operation; an optional predication indicator; an instruction mnemonic; a execution unit; a data register list; and ends with a comment following a ";".

The "||" indicates that the compiler has scheduled the instruction of this line to execute in parallel with the instruction of the previous line. This indicator may be chained to indicate parallel operation of up to 8 instructions.

All instructions can be made conditional based upon the data stored in a predication register. Such conditional instructions are prefaced by a register identity in square brackets [ ]. A [REG] prefix indicates the instruction will write its results only if the data in register REG is not zero. A [!REG] prefix indicates the instruction will write its results only if the data in register REG is zero.

The execution unit designation is a compiler command indicating one of the execution units in the VLIW processor which executes the instruction. The VLIW processor includes two separate data paths. Execution units in the first data path have suffixes of "1", those in the second data path have suffixes of "2". There are logical units L1 and L2, arithmetic units S1 and S2, data units D1 and D2, and multiply units M1 and M2. An "X" suffix in the execution unit designation indicates this instruction uses one of the limited cross paths between data paths by obtaining one operand from the opposite data path. The data units D1 and D2 are further characterized by one of two data paths T1 and T2.

These instructions employ the following instruction mnemonics. The data register designations are mnemonics with data registers in the first data path having an "A" prefix and data registers in the second data path having a "B" prefix. The mnemonic "*B++" for the store instructions indicates the base register is post incremented following the store operation.

TABLE 1

| Mnemonic | Data Registers | Action |
|---|---|---|
| ADD | scr1, scr2, dst | Add<br>dst = scr1 + scr2 |
| BDEC | scr, dst | Branch and decrement<br>If dst ≥ 0, then branch to<br>address in scr and dst = dst − 1 |
| CMPLTU | scr1, scr2, dst | Unsigned compare less than<br>If scr1 < scr2, then dst = 1<br>else dst = 0 |
| MV | scr, dst | Move<br>dst = scr |
| OR | scr1, scr2, dst | Logical OR<br>dst = scr1 OR scr2 |
| SHL | scr1, scr2, dst | Shift Left<br>dst = scr2 << scr1 |
| STB | scr, base | Store Byte<br>mem(base + offset) = scr |
| SUB | scr1, scr2, dst | Subtract<br>dst = scr1 − scr2 |
| ZERO | scr | Zero<br>scr = 0 |

Figure 2:
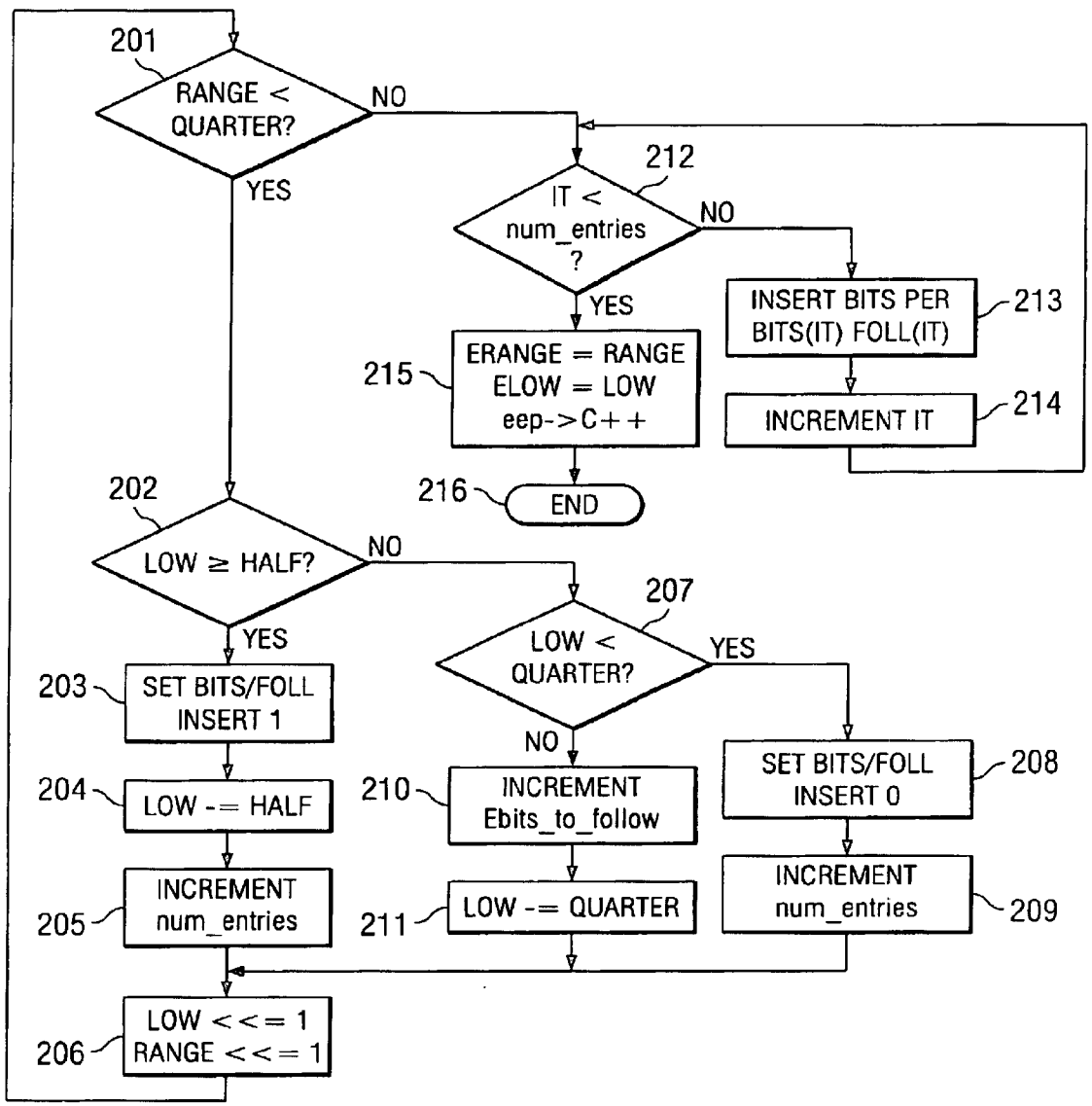
FIG. 2 illustrates the re-normalization function of one embodiment of this invention.

FIG. 2 illustrates the inventive process. The re-normalization function first tests to determine if the range is less than QUARTER (decision block 201). If so (Yes at decision block 201), the re-normalization process tests to determine if low is greater than or equal to HALF (decision block 202). If so (Yes at decision block 202), then the re-normalization process sets the variables bits and foll for the current num_entries to insert a "1" into the encoded bit stream (processing block 203) and then HALF is subtracted from low (processing block 204). The re-normalization process increments num_entries to the next integer (processing block 205). Next the re-normalization process left shifts low and range by one bit (processing block 206) effectively multiplying these variables by 2. Control then returns to the beginning of the loop at decision block 201.

In case low is not greater than or equal to HALF (No at decision block 202), then the re-normalization process tests to determine if low is less than QUARTER (decision block 207). If so (Yes at decision block 207), then the re-normalization process sets the variables bits and foll for the current num_entries to insert a "0" into the bit stream (processing block 208). The re-normalization process increments num_entries to the next integer (processing block 209). The re-normalization process then left shifts low and range (processing block 206) and returns to the beginning of the loop at decision block 201. If low is not less than QUARTER (No at decision block 207), the re-normalization process increments Ebits_to_follow (processing block 210). The re-normalization process then subtracts QUARTER from low (processing block 211). The re-normalization process then left shifts low and range (processing block 206) and returns to the beginning of the loop at decision block 201.

The re-normalization process continues in this loop until range is greater than or equal to QUARTER (No at decision block 201). If this is the case, the re-normalization does the bit insertion from the variables bits and foil. First, the re-normalization process checks to determine if it is less than num_entries (decision block 212). If so (Yes at decision block 212), the re-normalization processes inserts bits corresponding to bits(it) and foll(it) (processing block 213). The re-normalization processes increments it (processing block 214) and repeats the loop at decision block 212. The re-normalization process remains in this look until it is greater than or equal to num_entries (No at decision block 212). Thereafter the re-normalization process performs the final clean up (processing block 215) and then ends (exit block 216).

In a second embodiment of this invention, the number of times the re-normalization loop will execute is computed by the formula:

$$num\_iterations = lmbd(l, range) - lmbd(l, QUARTER)$$

where: lmbd is the leftmost bit detect for 1 or 0 depending on the first parameter. Thus the number of iterations (num_iterations) is the left most 1 of the range (lmbd(1, range)) minus the left most 1 of QUARTER (lmbd(1, QUARTER)). The original prior art code (FIG. 1) performed two things each loop. This prior art code doubled range every iteration when range was less than QUARTER. The prior art code also adjusted low and determined the bits to be inserted. Using the left most bit detect instruction to initially determine the number of times the re-normalization loop will iterate, the adjustment of range can be done in one step. Since QUARTER is a fixed constant depending on the number system selected, lmbd(1, QUARTER) can be precomputed. For example in a Q10 number system, 1 would be represented as 1024 and QUARTER as 256. Placing "256" in a 32-bit word (0000 0000 0000 0000 0000 0000 1000 0000) results in a left most one of 25. Subtracting the left most one of QUARTER from the left most one of range yields the number of doublings of range required before range exceeds QUARTER.

The range update can be performed only once following the loop rather than being performed in each loop. This computed as follows:

range=range<<num_iterations

Note that if range is initially greater than QUARTER, num_iterations would be less than zero. In this event, no re-normalization would be required. An initial loop test should skip the loop and not change range.

With this change, the loop that determines the variable length bit fields to be inserted can now be run a deterministic number of times given by num_iterations. Each iteration of the decision tree results in either one or two new variable length entry fields depending on the value of low. There is no direct correlation between num_iterations and the number of variable length strings that are produced. All that is known is that re-normalization never produces more than 2*num_iterations variable length strings to be inserted. For this reason, the re-normalization loop cannot be eliminated by optimization even though the number of loop iterations is known. Neither the number of variable length entries produced nor their bit patterns can be known before running the loop.

Figure 3:
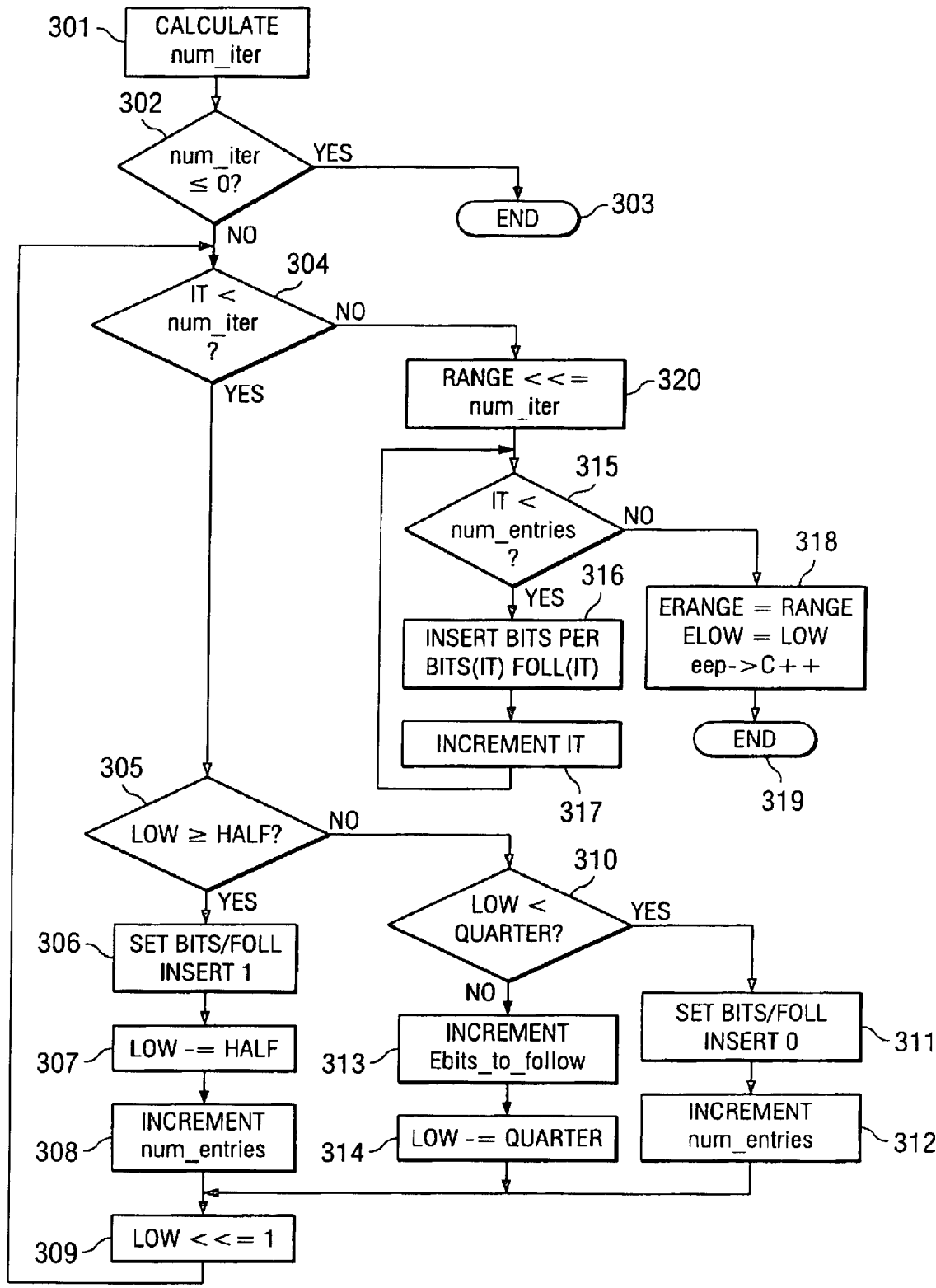
FIG. 3 illustrates the re-normalization function in which the number of loop iterations is calculated before beginning the loop.

FIG. 3 illustrates this embodiment of the invention. The re-normalization process first calculates the number of iterations (num_iter) from range as noted above (processing block 301). The re-normalization process tests to determine if the calculated number of iterations is less than or equal to zero (decision block 302). If so (Yes at decision block 302), then range does not need re-normalization and the process ends (exit block 303). If not (No at decision block 302), then the re-normalization loop runs for the calculated number of iterations (decision block 304). The re-normalization process tests to determine if low is greater than or equal to HALF (decision block 305). If so (Yes at decision block 305), then the re-normalization process sets the variables bits and foll for the current num_entries to insert a "1" into the encoded bit stream (processing block 306) and then HALF is subtracted from low (processing block 307). The re-normalization process increments num_entries to the next integer (processing block 308). Next the re-normalization process left shifts low by one bit (processing block 309). Control then returns to the beginning of the loop at decision block 304.

In case low is not greater than or equal to HALF (No at decision block 305), then the re-normalization process tests to determine if low is less than QUARTER (decision block 310). If so (Yes at decision block 310), then the re-normalization process sets the variables bits and foll for the current num_entries to insert a "0" into the bit stream (processing block 311). The re-normalization process increments num_entries to the next integer (processing block 312). The re-normalization process then left shifts low (processing block 309) and returns to the beginning of the loop at decision block 304. If low is not less than QUARTER (No at decision block 310), the re-normalization process increments Ebits_to_follow (processing block 313). The re-normalization process then subtracts QUARTER from low (processing block 314). The re-normalization process then left shifts low (processing block 309) and returns to the beginning of the loop at decision block 304.

The re-normalization process continues in this loop for the calculates number of iterations (No at decision block 304). If this is the case, the re-normalization does the bit insertion from the variables bits and foll. First, the re-normalization process checks to determine if it is less than num_entries (decision block 315). If so (Yes at decision block 315), the re-normalization processes inserts bits corresponding to bits(it) and foll(it) (processing block 316). The re-normalization processes increments it (processing block 317) and repeats the loop at decision block 315. The re-normalization process remains in this look until it is greater than or equal to num_entries (No at decision block 315). Thereafter the re-normalization process performs the final clean up (processing block 318) and then ends (exit block 319).

Decoupling the determination of the variable bit strings (re-normalization loop) and the insertion of the variable bit strings into the bit-stream significantly improves the overall performance. This decoupling ensures no dependencies between these loops. This decoupling allows use of an existing hardware Huffman encoder for arithmetic encoding. The variable bit strings produced by the re-normalization loop are no different from the variable bit strings used in Huffman encoding. Using hardware for bit insertion allows the next re-normalization or even other encoder tasks run during the bit insertion. This offers additional task level parallelism for speeding up the encoder task.

This decoupling is advantageous even in a pure software implementation. Writing these two loops separately enables pipelined versions of the re-normalization and bit-insertion loops with the guarantee of multiple iterations of the same loop. Performance on deeply pipelined digital signa processors or microprocessors can be significantly improved by waiting and building up a worklist of similar things to do. This could be several iterations of re-normalization loop or several bit insertions of variable length bit strings.

Figure 4:
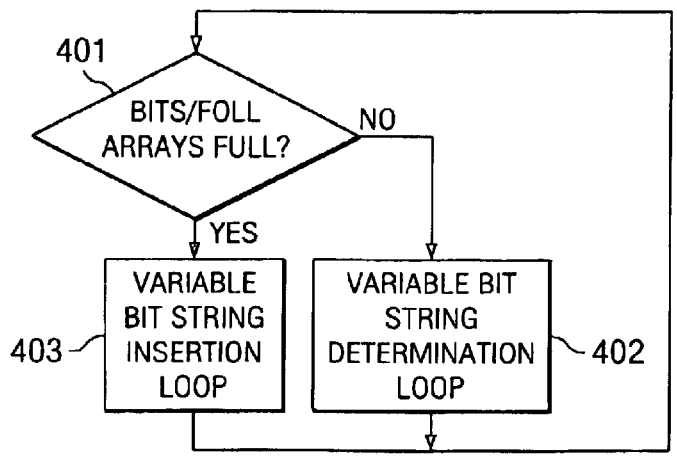
FIG. 4 illustrates one manner of exploiting the decoupling of the variable bit determination and the bit insertion.

FIG. 4 illustrates this process. The process begins by determining if the bits [ ] and foll [ ] arrays are full (decision block 401). If these arrays are not full (No at decision block 401), then the process performs a variable bit string determination loop (processing block 402) as previously described in conjunction with FIGS. 2 and 3. Each such loop will employ entries in the arrays bits [ ] and foll [ ]. The process continues to perform such variable bit string determination loops until the bits [ ] and foll [ ] arrays are full (Yes decision block 401). The process then inserts the variable bit strings (processing block 403) using a loop as previously described in conjunction with FIGS. 2 and 3. The following loop may also be employed.

```
for ( it = 0; it < num_large_entries; it++)
{
    Ebits_to_follow = foll[it];
```

```
    put_one_bit_plus_outstanding(bits[it]);
}
``` where: num_large_entries is the cumulative sum of several num_entries from several variable bit string determinations as processing block 402. The process can then reuse the bits [ ] and foll [ ] arrays by repeating the whole process. Thus the bit insertion can be run at some arbitrary time, after accumulating a sufficient number of entries. This amount depends on how much memory allocated to the two arrays bits [ ] and foll [ ].

Implementations based on this idea achieve a performance of about 20 cycles/input bit to be encoded. This is the worst case assuming each bit resulted in a symbol to be coded. This is not generally the case in compression. There are: 4*(0–3) iterations of re-normalization loop of 0–12 cycles/bit; 5 cycles for setup code; and if the variable length coding (VLC) is done in software, there are 3 cycles/encoded symbol sequence or bits/foll pair.

This invention is unique in the following ways. This invention is a novel method of increasing the available instruction level parallelism (IPC) by decoupling the re-normalization loop and the bit-insertion task required to create the encoded bit-stream. This makes all software implementations of CABAC based encoding significantly faster on digital signal processors that can exploit instruction level parallelism. Digital signal processors of this type include the very long instruction word (VLIW) Texas Instruments TMS320C6000 digital signal processors. This de-coupling permits multi-processing to improve performance either in an all software approach or a combined software/hardware solution. When a joint hardware/software solution is employed, this invention has the additional benefit of being able to re-use the Huffman hardware with minimum modifications. Such hardware to support Huffman encoding may already present on the data processor employed. This ability to support CABAC with minimal changes to existing Huffman hardware makes this invention particularly attractive. In terms of computer architecture, this approach adds task level parallelism (TLP) on top of the instruction level parallelism (ILP) from the decoupling of the re-normalization and bit insertion. The de-coupling of these two tasks of this invention thus exposes previously hidden underlying instruction level parallelism and task level parallelism.

This invention is advantageous for the following reasons. This invention provides the ability to implement H.264 based CABAC encoding efficiently on VLIW DSP platforms for imaging/video. This invention can exploit existing Huffman encoding hardware for speeding a hardware/software implementation of CABAC. This invention is applicable to digital still cameras (DSC) and digital signal processor systems adapted for implementing video standards.

What is claimed is:

1. A method of re-normalization in context based adaptive binary arithmetic encoding comprising the steps of:
    operating a first loop
        determining insertion of a 1 or a 0, and
        storing the determination in at least one temporary variable; and
    operating a second loop to iteratively insert bits dependent upon said at least one temporarily variable.

2. The method of re-normalization of claim 1, wherein:
    said step of operating said first loop includes counting a number of insertion determinations of said first loop; and
    said step of operating said second loop includes iteratively inserting bits a number of times corresponding to said number of insertion determinations of said first loop.

3. The method of re-normalization of claim 1, wherein:
    operating a large loop including said first loop and said second loop whereby said step of operating said first loop for a current iteration of said large loop and said overlaps said step of operating said second loop for an immediately prior iteration of said large loop.

4. The method of re-normalization of claim 1, wherein:
    said step of operating a second loop to iteratively insert bits includes supplying corresponding inputs to a Huffman variable length encoding hardware unit.

5. The method of re-normalization of claim 1, wherein:
    said step of operating said first loop includes
    left shifting a range by one bit each iteration of said first loop, and
    ending said first loop when range is greater than or equal to QUARTER.

6. The method of re-normalization of claim 1, wherein:
    said step of operating said first loop includes
    determining a left most one bit position of QUARTER,
    determining a left most one bit position of a range,
    determining a number of iterations of said first loop by subtracting the left most one bit position of QUARTER from the left most one bit position of range, and
    left shifting range a number of bits equal to said number of iterations.

7. The method of re-normalization of claim 1, wherein:
    said first loop is performed plural times unit an amount of memory allocates to said at least one temporary variable is full; and
    said second loop is performed until all insertions of said stored determination in said at least one temporary variable are made.

* * * * *